United States Patent [19]

Kemner et al.

[11] Patent Number: 4,616,181

[45] Date of Patent: Oct. 7, 1986

[54] NUCLEAR MAGNETIC RESONANCE TOMOGRAPHY APPARATUS

[75] Inventors: Rudolf Kemner; Dirk Sinnema, both of Eindhoven, Netherlands

[73] Assignee: U.S. Philips Corporation, New York, N.Y.

[21] Appl. No.: 539,581

[22] Filed: Oct. 6, 1983

[30] Foreign Application Priority Data

Oct. 12, 1982 [NL] Netherlands ............... 8203934

[51] Int. Cl.4 ............................................. G01R 33/20
[52] U.S. Cl. ......................................... 324/309; 324/318
[58] Field of Search ........................... 324/236–238, 324/309–311, 313–316, 318, 319, 321, 322; 335/299; 333/219; 436/173

[56] References Cited

U.S. PATENT DOCUMENTS

| 4,259,638 | 3/1981 | Krueger | 324/318 |
| 4,411,270 | 10/1983 | Damadian | 324/309 |
| 4,439,733 | 3/1984 | Hinshaw | 324/313 |
| 4,449,097 | 5/1984 | Young | 324/309 |
| 4,452,250 | 6/1984 | Chance | 324/311 |
| 4,521,734 | 6/1985 | Macovski | 324/311 |

OTHER PUBLICATIONS

Meredith, A New Method for Measuring the Amplitude of De Haas-Van Alphen Oscillations, Aug. 1975, Figure, Holland.

Primary Examiner—Michael J. Tokar
Attorney, Agent, or Firm—Jack E. Haken

[57] ABSTRACT

The transmitter/measurement coil of a nuclear magnetic resonance tomography apparatus for medical diagnosis in which comparatively high Larmor frequencies are used, is divided into a number of parallel-connected subcoils. The self resonance frequency of the coil can thus be made substantially higher than the Larmor frequency, with the result that the coil will have a suitably improved quality factor at higher frequencies, and measurements can be performed with an acceptable signal-to-noise ratio.

6 Claims, 5 Drawing Figures

NUCLEAR MAGNETIC RESONANCE TOMOGRAPHY APPARATUS

The invention relates to a nuclear magnetic resonance tomography apparatus comprising, a coil system for generating a primary magnetic field and a coil system for generating a pulsed r.f. magnetic field which are arranged about an examination space for an object to be measured, and also comprising a measurement device for the detection of nuclear magnetic resonance signals generated in the object.

A nuclear magnetic resonance tomography apparatus of this kind is known from computer tomography 1 (1981), pages 2-10. In an apparatus of this kind, an r.f. magnetic field is produced by means of an r.f. transmitter coil in order to excite nuclear magnetic resonance signals in an object to be examined. Customarily the same coil is used for the measurement of free induction magnetic resonance signals thus generated. In order to generate sufficiently strong signals, for example for performing a medical diagnosis on a patient, it is necessary to use comparatively strong primary fields of, for example, up to 0.2 Tesla for resistive magnets and up to 0.5 Tesla or more for superconducting magnets. Using the known gyromagnetic ratio, this results in an operating frequency (usually referred to as the Larmor frequency) for carrying out measurements for proton magnetic resonance signals, for example up to approximately 9 MHz for resistive magnets and up to approximately 20 MHz for superconducting magnets.

However, it has been found that in known apparatus a poor signal-to-noise ratio occurs in the measurement signals at the high measurement frequencies required for medical diagnosis. Investigations have revealed that this poor ratio is caused mainly by the fact that the quality factor Q of the transmitter/measurement coil decreases as the operating frequency increases so that, for example, at 20 MHz useful measurements are often no longer possible.

It is the object of the invention to mitigate this drawback; to this end, the nuclear magnetic resonance tomography apparatus in accordance with the invention is characterized in that the self resonance frequency of the r.f. coil is substantially higher than the highest frequency component of resonance signal which is to be measured.

The invention is based on the recognition of the fact that at higher frequencies the exchange of energy in a resonant network between the inductance of $(0.5 \ L \ i^2)$ and the capacitance $(0.5 \ C \ V^2)$ formed by the distributed stray capacity of the inductance, is less favourable than in a situation in which the capacitance is formed by an external high-quality capacitor. This means that the resonant frequency of the inductance with its own capacity must be high with respect to the the Larmor frequency. When this condition is satisfied, the quality factor Q can be maintained at a reasonably high level, even for high operating frequencies.

The transmitter/measurement coil of a preferred embodiment of a nuclear magnetic resonance tomography apparatus in accordance with the invention consists of a double saddle-shaped coil comprising winding sections which are driven in parallel. The effective coil surface area thus remains the same as the prior art, but the self resonance frequency f(p) becomes substantially higher. In order to prevent an increase of the value of the stray capacitance C(p), the wires forming the windings and the connections must be mounted so that they closely adjoin one another. It may be advantageous that the wires should take the form of a flat-tape in the regions where they contact one another. Each of the saddle-coil windings is preferably divided into four winding sections (sub-coils) which can be driven in parallel. The wires of each of the winding sections are preferably connected together at points which are symmetrically situated with respect to the sub-coils; if necessary, these points are connected to connection points which are symmetrically situated on the connection wires for driving and reading. For electrically screening the axial spaces between the two saddle coils thus formed, each of which may cover an angle of, for example, approximately 120°, for example, a comb-shaped assembly of electrical conductors interconnected at one end only, may be provided in these regions.

Some preferred embodiments in accordance with the invention will be described in detail hereinafter. Therein:

Figure 1:
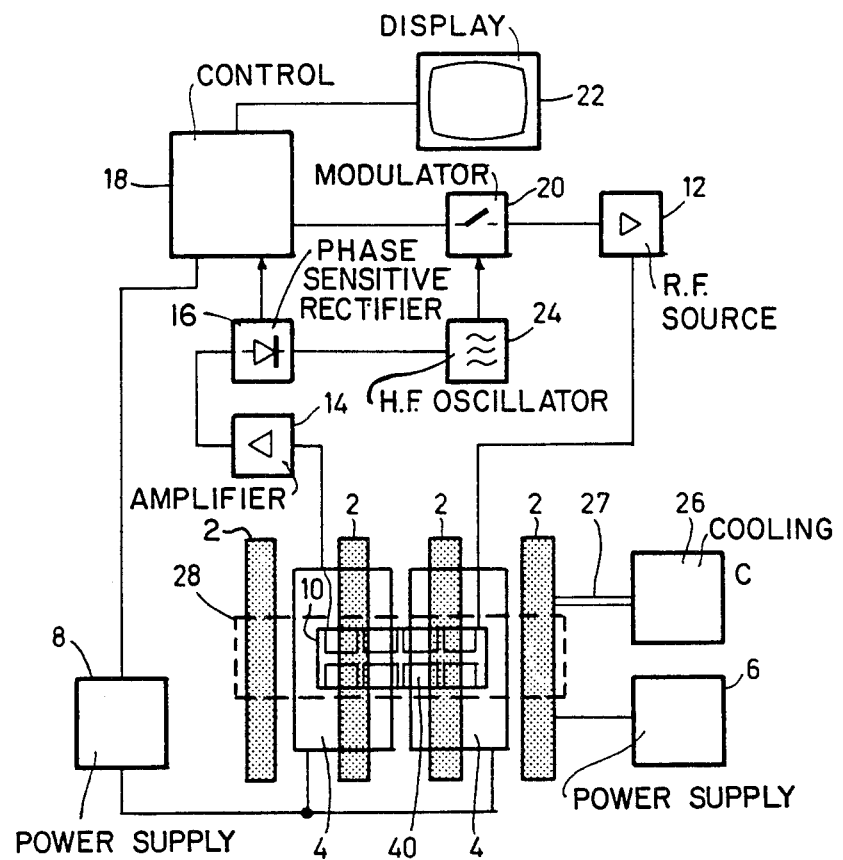
FIG. 1 shows a block diagram of a nuclear magnetic resonance tomography apparatus in accordance with the invention.

A nuclear magnetic resonance tomography apparatus as shown in FIG. 1 comprises magnet coils 2 for generating a steady homogeneous magnetic field, magnet coils 4 for generating a quasi-steady gradient field, a power supply source 6 for the magnet coils 2, and a power supply source 8 for the magnet coils 4. A magnet coil 10 serves to generate a pulsed r.f. magnetic field, for which purpose it is connected both to an r.f. source 12 and for detecting free induction signals generated by the r.f. field in an object to be measured. For the purpose of detection the coil 10 is connected to a signal amplifier 14. The signal amplifier 14 is connected to a phase-sensitive rectifier 16 which is connected to a central control device 18. The central control device 18 also controls a modulator 20 for the r.f. source 12, the power supply source 8 for the quasi-steady gradient field, and a monitor 22 for image display. A high frequency oscillator 24 controls both the modulator 20 for the r.f. source 12 and the phase-sensitive rectifier 16 for processing the measurement signals. A cooling device 26 with cooling ducts 27 is provided for cooling the magnet coils which generate the primary field. Such a cooling device may be constructed for water cooling resistive magnets or for liquid helium cooling superconducting magnets. The invention can be used notably, but not exclusively, for superconducting magnets, because these magnets generate comparatively strong magnetic fields and hence comparatively high magnetic resonance signal frequencies. A Faraday cage 28 encloses a measurement space in the apparatus and surrounds the transmitter/measurement coil 10, but is situated within the coils 2 and 4 which generate the primary magnetic field in accordance with a Netherlands Patent Application No. 8203621.

Figure 1A:
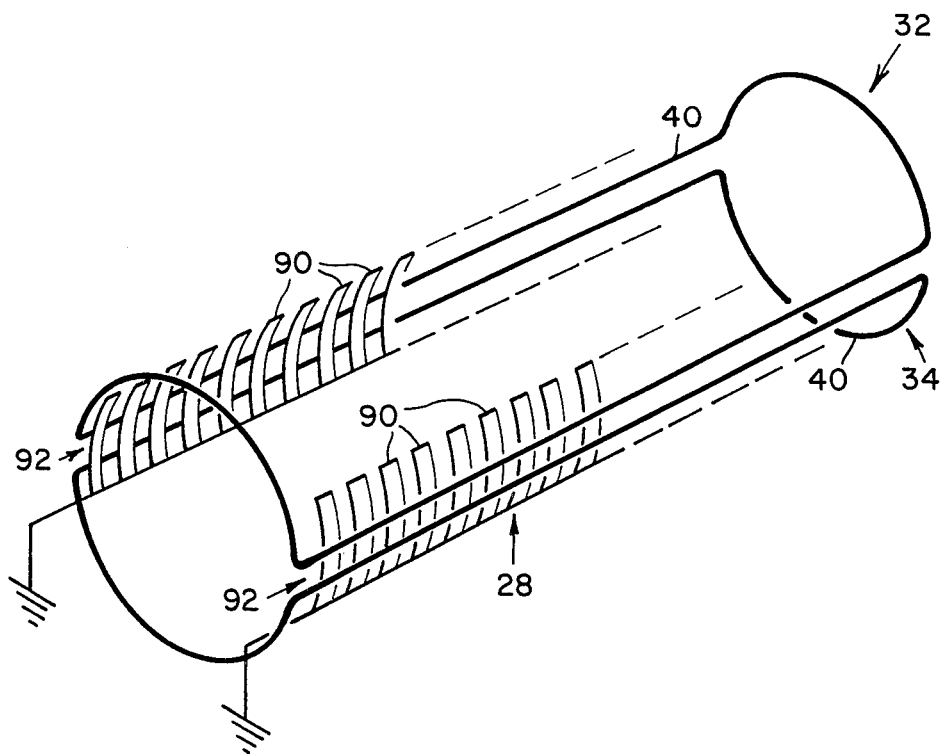
Figure 2:
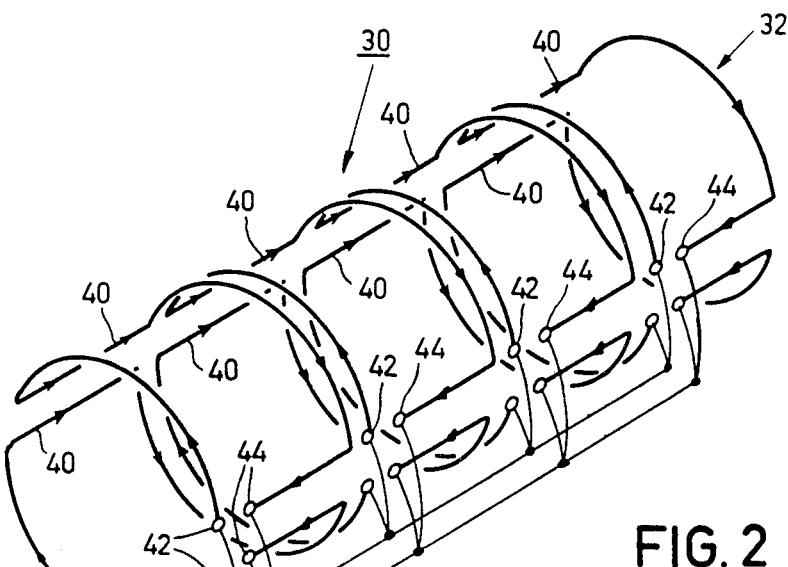
FIG. 2 shows a preferred embodiment of an appropriate transmitter/measurement coil.

FIG. 2 shows diagrammatically a preferred embodiment of a transmitter/measurement coil. Such a coil 30 is actually a double saddle-shaped coil and customarily consists of two coil halves 32 and 34. The coil is excited by an r.f. source 36 which preferably includes a tuning capacitor 38. The Faraday cage may comprise a comb-shaped assembly of electrical conductors 90 (FIG. 1a) which are interconnected at one end and are disposed in the axial spaces 92 between the coil halves 31 and 34.

In accordance with the invention, each of the coil halves is divided into sub-coils; in this case each half is divided into four sub-coils-40, whose end faces adjoin one another. The number of sub-coils will be chosen to be as small as possible provided that the frequency range extends high enough. Each of the sub-coils is provided with connection points 42 and 44. In this embodiment all the connection points 42 are connected to a power supply line 46, and all the connection points 44 are connected to a power supply line 48. The corresponding connection points of the sub-coils of the second coil half 34 (unreferenced for the sake of clarity) are also connected to these power supply lines. The source 36 excites the sub-coils in parallel, at least with respect to each coil half; in fact, two coil halves are formed in this case which each comprise four sub-coils, with the result that the loss resistances and the inductances are in parallel in the sub-divided situation, so that a coil is obtained which has a higher self resonance frequency; consequently, the quality factor is substantially improved for the relevant high operating frequency. For the construction of such a coil it is important that the situation in which the assembly behaves as though it were a single coil should be maintained with respect to each element in an object to be measured, and that the stray capacitance of the coil system should not be increased. Therefore, the power supply connection should preferably be as symmetrical as possible and the coil wires at the sub-coil interconnections should be mounted so that they firmly adjoin one another.

Figure 3:
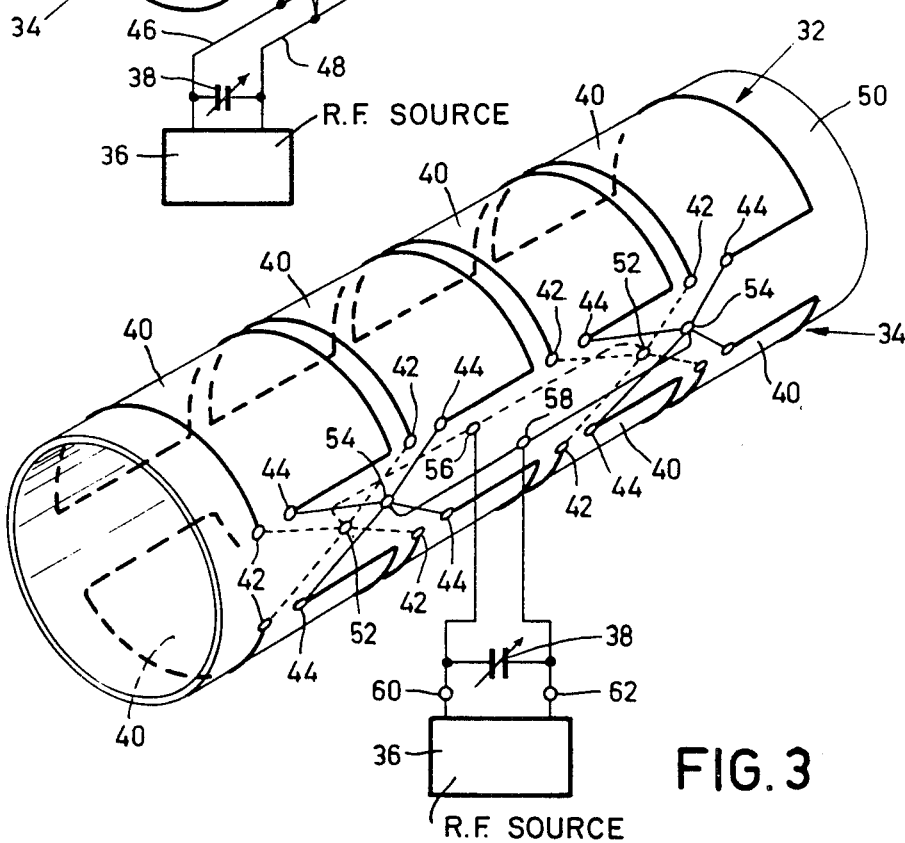
FIG. 3 shows a preferred embodiment of such a coil comprising symmetrical connections.

In a preferred embodiment of a coil as shown in FIG. 3, therefore, the connection points 42 of the sub-coils 40 of both coil halves 32 and 34 which are provided on an electrically insulating cylinder 50 are pair-wise connected to junctions 52 which are symmetrically situated with respect to the sub-coils, the connection points 44 being similarly connected to symmetrically situated junctions 54. Both or several junctions are further connected to respective symmetrically situated connections 56 and 58. The power supply source 36 with the tuning capacitor 38 is connected across the connections 56 and 58. During the measurement phase a magnetic resonance induction signal measurement device is connected between the terminals 60 and 62.

Figure 4:
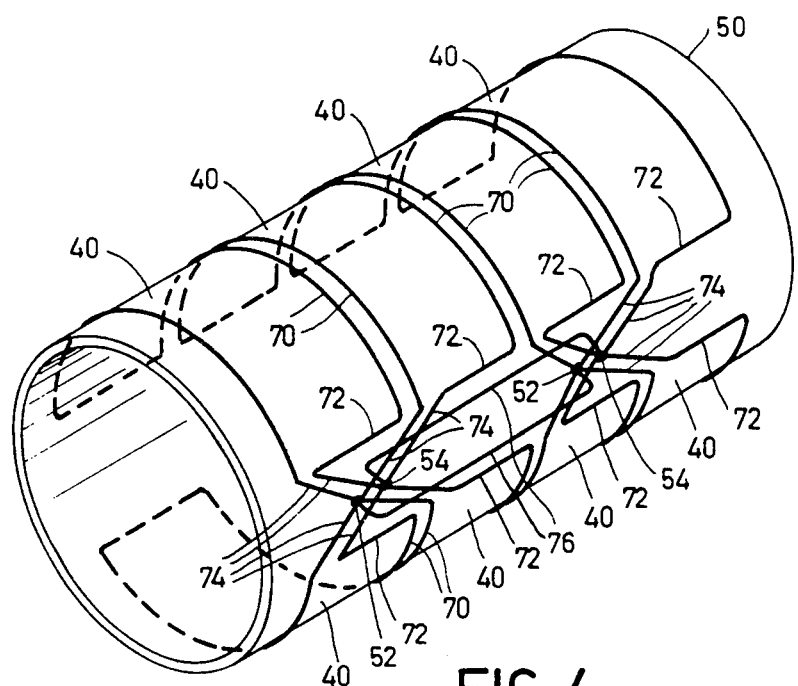
FIG. 4 is a structural drawing of such a coil.

FIG. 4 is a more structural perspective representation of the same coil. In the region of the sub-coil transition parts 70 of the wire turns on the plactics cylinder 50 are arranged as closely as possible against one another; if desired, tape-shaped wire can be used for this purpose. Wire portions 72 are arranged so that they follow the course of the originally continuous wire as well as possible. Wire portions 74 are again arranged as near as possible to one another in pairs; this means one for each junction 52 and 54 so that they carry current in opposite directions, the pairs thus formed being situated in an optimally symmetrical arrangement with respect to the relevant sub-coils. Wire portions 76 which interconnect the junctions are again arranged as near as possible to and preferably against one another, at least as far as they form the current leads of a sub-coil feed.

Figure 5:
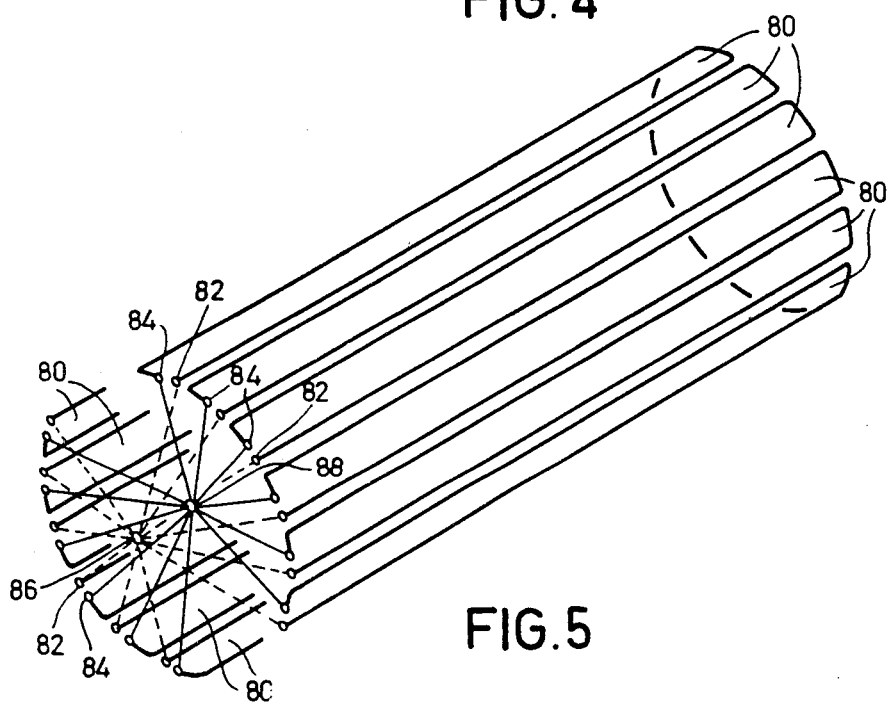
FIG. 5 shows a preferred embodiment of a transmitter/measurement coil with an azimuthal coil subdivision.

Instead of the axial sub-division of coil halves described thus far, the embodiment shown in FIG. 5 is sub-divided circumferentially. Each of the coil halves 32 and 34 is sub-divided into six sub-coils 80, each of which comprises connection points 82 and 84. The connection points are again optimally symmetrically connected to connection points 86 and 88 of the power supply source (not shown) or the measurement device for the r.f. field or the magnetic resonance signals. It is to be noted that there preferably should be no connections in the open end of the coil assembly in order to permit the introduction and removal of objects to be measured. This coil can be arranged on an insulating supporting cylinder in a similar manner to that shown in FIG. 4.

Even though so far only one turn of wire has been mentioned for the coils, the coils may be composed of several conductors (turns) as long as the resonance frequency f(p) resulting from the self capacitance is high with respect to the operating frequency.

Each of the sub-coils may be connected to its own individual read amplifier. The read signals therefrom can be processed as a sum signal. The quality factor Q is thus increased because the power supply wires can be dispensed with. It is then desirable to construct the transmitter coil and the measurement coil as individual different coils. These coils may then be oriented, for example, transversely with respect to one another.

The invention has been described mainly with reference to proton resonance. Protons or hydrogen nuclei, of course, are present at a high concentration in biological objects. The concentration of other nuclei of medical interest, such a phosphorous, sodium and the like is much lower. Consequently, a substantially smaller resonance signal occurs when resonance measurements are performed thereon in similar circumstances. Therefore, the use of a coil having a high quality factor is important. The Larmor frequency for these nuclei may be lower for the same primary field, but in order to obtain a reasonably strong resonance signal it is desirable to have a stronger primary field available for the measurement.

Instead of the described circuit comprising a separate amplifier for each of the sub-coils, parallel current control can also be applied. The original signal intensity being maintained, the coil resistance and hence the noise is then reduced, so that a better signal-to-noise ration is obtained.

For an operating frequency of approximately 20 MHz it has been found that a signal-to-noise ratio improvement of 5 dB can be readily achieved in an apparatus in accordance with the invention.

We claim:
1. In nuclear magnetic resonance tomography apparatus which comprises:
first coil means for generating a primary magnetic field;
second coil means for generating a pulsed RF magnetic field,
said first and second coil means being disposed around a substantially cylindrical examination space for an object to be examined; and
measurement means for detecting nuclear magnetic resonance signals which are generated in the object; the improvement wherein:
the self-resonance frequency of the second coil means is substantially higher than the highest frequency component of the resonance signals which are to be detected;

the second coil means comprises two saddle-shaped coils which are disposed on diametrically opposite sides of the examination space, each of said saddle-shaped coils comprising at least two sub-coils;

each of the sub-coils comprises a winding; further comprising means which supply the sub-coils with pulsed radio frequency electric current;

the windings of all the sub-coils being connected, in parallel, to the means which supply them with pulsed radio frequency electric current.

2. The apparatus of claim 1 wherein, in each of the saddle-shaped coils, the sub-coils are separated from one another by planes which extend perpendicular to the axis of the substantially cylindrical examination space.

3. The apparatus of claim 1 wherein, in each of the saddle-shaped coils, the sub-coils are separated from one another by planes which extend perpendicular to the axis of the substantially cylindrical examination space.

4. A nuclear magnetic resonance tomography apparatus as claimed in any one of claims 3, 2, or 1 further comprising comb-shaped electrical screening elements disposed in openings between the two saddle-shaped coils.

5. A nuclear magnetic resonance tomography apparatus as claimed in any one of claims 3, 2 or 1, wherein the first coil means comprises a superconducting magnet coil.

6. The apparatus of claim 1 wherein each of the sub-coils comprises a winding and the windings of all of the sub-coils are connected, in parallel, to means which supply them with pulsed radio frequency electric current.

* * * * *